United States Patent
Chen et al.

(10) Patent No.: US 7,160,813 B1
(45) Date of Patent: Jan. 9, 2007

(54) ETCH BACK PROCESS APPROACH IN DUAL SOURCE PLASMA REACTORS

(75) Inventors: Cindy W. Chen, San Jose, CA (US); Eddie Chiu, Pleasanton, CA (US); Mavis J. Chaboya, San Jose, CA (US); Yuh-Jia Su, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 206 days.

(21) Appl. No.: 10/293,661

(22) Filed: Nov. 12, 2002

(51) Int. Cl.
*H01L 21/302* (2006.01)

(52) U.S. Cl. ............... 438/710; 438/706; 438/712; 156/345.35

(58) Field of Classification Search ........... 438/706, 438/710, 712, 714, 720; 156/345.35, 345.36; 216/58, 67, 69
See application file for complete search history.

(56) References Cited

U.S. PATENT DOCUMENTS

| 5,035,768 | A | | 7/1991 | Mu et al. | |
|---|---|---|---|---|---|
| 5,164,330 | A | * | 11/1992 | Davis et al. | 438/654 |
| 5,290,382 | A | * | 3/1994 | Zarowin et al. | 156/345.35 |
| 5,877,032 | A | * | 3/1999 | Guinn et al. | 438/9 |
| 5,909,637 | A | * | 6/1999 | Charneski et al. | 438/687 |
| 6,509,618 | B1 | * | 1/2003 | Jan et al. | 257/413 |
| 6,635,185 | B1 | * | 10/2003 | Demmin et al. | 216/64 |
| 6,667,208 | B1 | * | 12/2003 | Oh et al. | 438/244 |
| 6,667,244 | B1 | * | 12/2003 | Cox et al. | 438/712 |
| 6,693,043 | B1 | * | 2/2004 | Li et al. | 438/725 |
| 2002/0127840 | A1 | * | 9/2002 | Smith et al. | 438/618 |

* cited by examiner

*Primary Examiner*—Lan Vinh
(74) *Attorney, Agent, or Firm*—Parsons Hsue & de Runtz LLP (57) ABSTRACT

A method is disclosed for removing a polysilicon layer from a semiconductor wafer, in which a downstream plasma source is used first to planarize the wafer, removing contours in the polysilicon layer caused by deposition over lithographic features, such as via holes. The planarizing process is followed by exposure to a plasma made by a direct, radio frequency plasma source, which may be in combination with the downstream plasma source, to perform the bulk etching of the polysilicon. The invention can produce planar surface topography after the top layer of the film is removed, in which the residual recess height of the polysilicon plug filling a via hole is less than about about 10 nm.

32 Claims, 5 Drawing Sheets

ETCH BACK PROCESS APPROACH IN DUAL SOURCE PLASMA REACTORS

FIELD OF THE INVENTION

The present invention relates to a process for making integrated circuit structures. More particularly, this invention relates to processes for removing deposited layers from an integrated circuit structure.

BACKGROUND OF THE INVENTION

During various integrated circuit (IC) fabrication steps, numerous layers are deposited onto lower layers which may have previously defined lithographic features such as trenches and holes formed therein. These deposited films often show a conforming surface to the topography of the underlying trenches and holes, as the deposited layers fill in these features. Therefore, a non-uniform surface with various dimple areas and depths will form as a result of the trench and hole features. A non-uniform film surface can interfere with subsequent IC fabrication steps such as photolithography, film depositions and film removals, and can cause yield loss from non-functional devices. Planarization of non-uniform surfaces is therefore a critical step in IC manufacturing.

For example, it is often desired to form an electrical connection to a conductive layer lying underneath an insulating dielectric layer. These connections are made by lithographically patterning a set of holes, or vias, through the dielectric layer to the conducting layer, and depositing a conductive material, for example polysilicon, in the holes. The excess conductive material can then be removed from the surface of the dielectric layer by an etch back process, leaving the conductive material only in the vias, and not on the surrounding surface.

It is an ongoing challenge for etch back processes to remove the conductive material thoroughly, while leaving a smooth, planar surface, with little or no surface topography in the vicinity of the vias. A figure of merit for an etch back process is the reduction of the recess height, which is the height differential between the planar surface and the top of the polysilicon plug filling the vias. In general, a recess height of less than 30 nm is specified for IC processes.

Achieving a planar surface after deposition is therefore a primary goal of etch back processes, processes used to remove a portion of a previously deposited material. Traditionally, a substantially planar surface is achieved by chemical mechanical polishing (CMP) tools or a high density plasma etcher. CMP is an abrasive process, in which material is removed by applying a rotating pad under pressure against the substrate, in the presence of an abrasive compound or slurry. The slurry is chosen to selectively remove one film over another. While CMP enjoys widespread use in the IC industry, it is expensive, and requires frequent operator maintenance to replace the pads or handle the slurry. The process is also slow, requiring long process times, which increases the cost of ownership of the tool. Lastly, most CMP slurry removes the polysilicon material preferentially to the oxide, and therefore leaves recesses at the sites of the polysilicon plugs. CMP typically produces wafers that have a recess height in excess of about 30 nm.

Alternatively, an ion etcher can be used to remove a top layer of polysilicon. However the ion etchers also tend to leave topography over the dimple areas, as the charged species are attracted to the corners of the topography because of the high fields existing there. Therefore, typical plasma etchers tend to accentuate already existing contours, and are not very effective at planarizing contoured areas remaining near lithographically patterned features.

The development of a high throughput advanced thin film removal or etch back process is desirable. A method for the rapid removal of the bulk polysilicon film, which leaves a flat surface topography and very little recess height, is also desirable.

SUMMARY

The present invention is directed to a process approach whereby a film is planarized using a downstream plasma source, before bulk film removal using a dual, RF and downstream plasma source. The process approach is demonstrated on the etch back of a polysilicon film. The plasma gas comprises $O_2$ and $CF_4$ from a downstream plasma source, which serves to planarize the surface of the polysilicon, by etching the film over the flat areas at a faster rate than the film over the contoured areas. Next, the bulk removal of the film is accomplished by exposing the substrate to a direct, radio frequency (RF) plasma in combination with a downstream plasma. The process is capable of removing about 1.2 µm/minute of material.

The invention makes use of a downstream plasma source, which produces a high density of radicals (for example, greater than about $5e13\ cm^{-3}$) which interact chemically with the substrate surface. The distinguishing feature of a downstream plasma source is that the plasma gases are made to cross a neutralizing barrier, which neutralizes most of the ionized species in the gas through recombination at the neutralizing barrier. Therefore, the plasma generated from a downstream plasma source is rich in radicals that can react chemically with a substrate surface, while the density of ionized species is relatively low, for example, less than about $5e12\ cm^{-3}$.

The speed of the chemical reaction depends on the geometry of the features on the substrate, with the result that the speed of the reaction is faster on flat surfaces than on contoured surfaces. Therefore, as the substrate is exposed to the plasma, it tends to become planarized by interaction with the downstream plasma, as the flat areas are etched down until the contours are erased from the surface. After the substrate surface has been planarized, the substrate is exposed to a direct, RF plasma in combination with a downstream plasma, which performs most of the bulk film removal.

This invention achieves lower recess height than typical plasma etchers, because it uses a downstream source which generates little or no ionic population. Furthermore, since it is a dry plasma process, there is relatively little maintenance required, compared to, for example, CMP. The invention can also be applied to films other than polysilicon, for example, tungsten, copper, or silicon oxide.

DETAILED DESCRIPTION

The novel process is one in which the surface of the substrate is first exposed to a downstream plasma, which serves to reduce the topography on the surface. After planarization, the substrate can be exposed to the normal etching processes, generally including a RF plasma source. By planarizing the film first, the invention avoids the problem wherein the film removal process preserves or enhances existing topography on the substrate surface.

Figure 1:
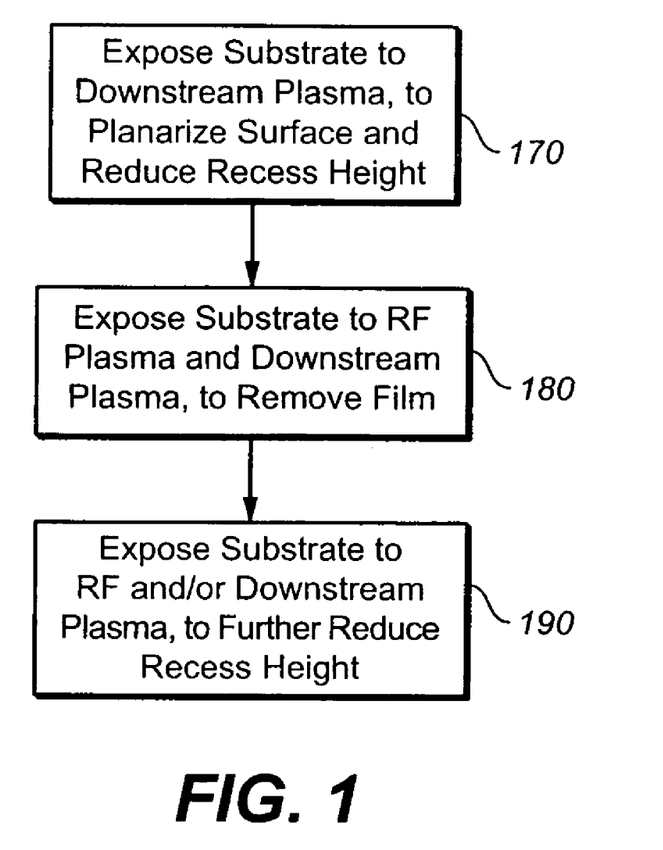
FIG. 1 is a simplified process flow for the application of this invention.

FIG. 1 illustrates the novel process flow. According to the process flow, the wafer is first exposed 170 to a downstream plasma, to planarize the surface and reduce recess height. The downstream plasma source has the distinguishing feature that the plasma gases are required to cross a neutralizing barrier, which neutralizes through recombination, most of the ionized species in the gas. It has been found that among the effects of a downstream plasma on a substrate, is the general flattening of the topography of the surface. It is hypothesized that the flattening occurs because the reactive species of the downstream plasma are electrically neutral, and isotropic. They therefore interact with the surface at a rate determined, in part, by their local concentration in the plasma gas. Areas which are confined, such as dimples and trenches, may deplete the concentration of radical reactive species locally, slowing their reaction rate locally. This may slow the reaction rate of the surface in the confined areas. Therefore, the radical-rich gas produced by the downstream plasma may react more quickly with the exposed, flat areas than with the dimpled areas, with the result that more polysilicon may be removed from the flat areas than from the dimple areas by the downstream plasma components. Eventually, the fast-etching flat surface areas will reach an even level with the slow-etching dimple area, planarizing 170 the whole polysilicon surface and leaving it with good uniformity for the removal 180 of the remaining polysilicon layer.

The term planarizing 170, as used here, refers to the approximate leveling of topographic features with respect to a reference surface. The topographic features are the dimples formed over the vias, and the reference surface is the surface of the dielectric layer surrounding the vias. The leveling of the topography should be such that the angle between a point of interest and a reference point on the reference surface is less than about 5 degrees. The remaining topography should have a roughness of less than or equal to about 30 nm with respect to the reference surface. The removal 180 of the polysilicon layer is achieved when about 90% or more of the material has been removed from the underlying dielectric layer, leaving polysilicon only in the vias.

After the film has been planarized by exposure to the downstream plasma, the bulk of the film is removed by exposing 180 the substrate to an anisotropic, direct, radio frequency (RF) plasma in combination with a downstream plasma. The RF or direct plasma is responsible for most of the anisotropic etching of the polysilicon by ions accelerated in the plasma. The ions are accelerated towards the wafer surface at directions substantially perpendicular to the plane of the wafer. Consequently, the ions impinge on the inclined surfaces less frequently than on the horizontal surfaces that are parallel to the wafer plane, and when they do strike the inclined surfaces, they do so at off-normal incidence angles. Charged ions bombard the horizontal surfaces with full intensity at or near normal incidence. The interactions between the substrate surface and the RF plasma products are therefore mainly ballistic, whereas in the case of the downstream source, they are mainly chemical. The RF plasma is primarily responsible for the rapid removal of the bulk of the polysilicon layer, because of the field-induced acceleration of the ions, as well as the plasma chemistry selectivity of the polysilicon over the oxide.

A third procedure 190 can be included in the process, which procedure involves the exposure of the substrate to another direct RF plasma and/or a downstream plasma, to further reduce the recess height for the polysilicon plug. The third procedure makes use of a process environment in which the selectivity of the etching plasma to the dielectric compared to the polysilicon, is reversed. Therefore the dielectric is removed at a faster rate than the polysilicon. This reverses any topography generated by the etch process, and reduces the remaining recess height of the polysilicon plug.

Figure 2:
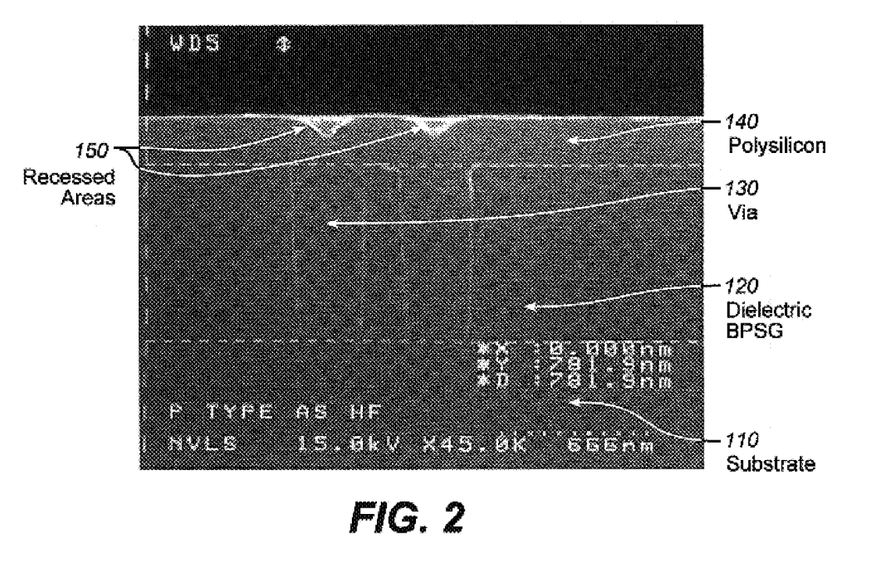
FIG. 2 shows a cross section of a portion of an integrated circuit device to which an embodiment of this invention may be applied.

FIG. 2 shows a portion of a generic integrated circuit device, upon which the invention may be practiced. The figure shows a silicon wafer 110 upon which a dielectric material 120 has been deposited. In this integrated circuit device, the dielectric material 120 is borophosphosilicate glass (BPSG), but the dielectric material can be any oxide. Vias 130 have been etched into the dielectric material 120 to allow electrical contact to a metallic underlayer such as a conducting gate (not shown). Polysilicon 140 has been deposited over the surface and into the via holes. The deposition of the polysilicon into the vias leaves a surface that conforms, to some extent, to the underlying layer, so that dimples or recessed areas 150 in the surface remain, registered over the polysilicon plugs in the via holes. It is desired to remove the top layer of the polysilicon 140, leaving the polysilicon plugs flush with the planar surface of the dielectric layer, without creating a recess over the plugs in the via holes.

Various dual source plasma systems can be used in connection with the process described in FIG. 1. Two such products, bearing the trademarks GAMMA™ and PEP IRIDIA™, are commercially available from Novellus, Inc. of San Jose, Calif. Both tools have the advantageous feature of having dual sources, a direct RF plasma source and a downstream plasma source operatively connected to the reactor chamber. These products are convenient for the application of this invention, as the different process conditions can be applied within the same tool.

Figure 3:
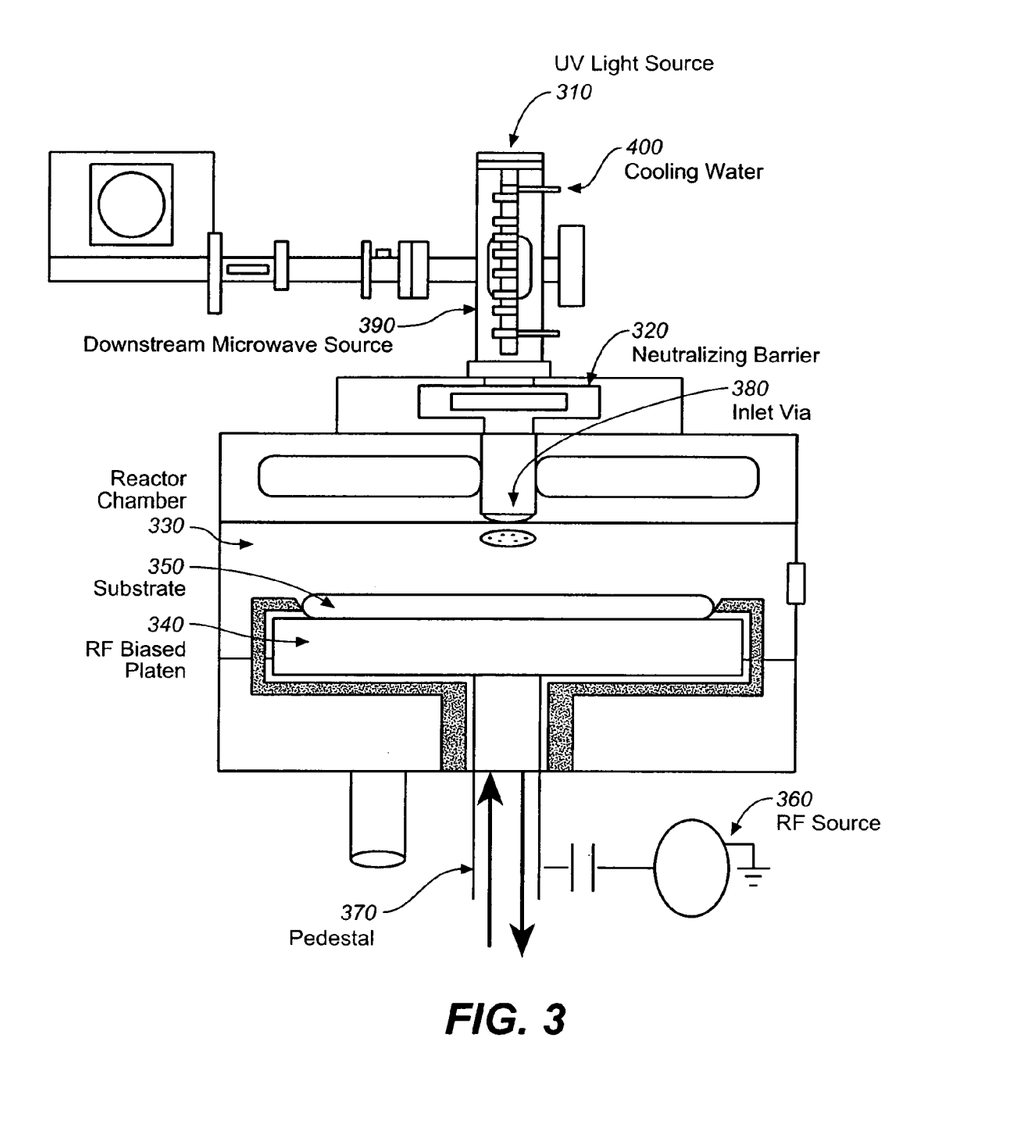
FIG. 3 is a simplified schematic diagram of a downstream plasma tool, equipped with a microwave plasma source for the downstream plasma.

As a first embodiment, the invention as described is implemented on a PEP IRIDIA dual source plasma system. A schematic diagram of the plasma system is shown in FIG. 3. Reactor chamber 330 contains the substrate 350 supported on a platen 340. The platen 340 is supported on a pedestal 370 which holds the substrate beneath the inlet via 380 from the downstream source 390. The platen is coupled to a heat source (not shown) to provide heat for the substrate. The heat source can be a radiative source such as a lamp, or a hot plate, for example. The platen 340 is electrically connected to the RF source 360 via the pedestal 370 which supplies radio frequency power to the platen.

A plasma gas is supplied to the chamber through a gas inlet, by vacuum fittings (not shown). The oscillating fields applied by the RF source 360 to platen 340 accelerate ions in the gas, causing them to collide with neutral species, ionizing the neutral species in turn, until a plasma is formed above the substrate 350 on the platen 340. Vacuum plumbing (not shown) is applied to the reactor chamber to allow the evacuation of the chamber to the required levels. The RF power supply is capable of delivering up to about 3000 W per wafer to the plasma. The chamber may be designed to accommodate multiple numbers of wafers, for example six, which may be processed simultaneously. In the case of multiple wafers, two or more wafers may share a downstream source.

The downstream source, which in this example is a microwave downstream (MWD) source 390, ionizes a gas in a separate chamber operatively connected to the reactor chamber 330 which contains the platen 340 and substrate 350. Alternatively, other downstream plasma sources may be used, such as an inductively coupled plasma (ICP) source. The MWD source can deliver up to about 3000 W per wafer to the downstream plasma. A microwave generator produces oscillating currents in the ions and electrons of the plasma gas. These ions and electrons transfer energy to other atoms in the gas by collisions to create a microwave plasma. The plasma is initiated by applying, for example, a UV light source 310 or other source of ionizing radiation, to the aperture of the MWD source. The UV light source 310 causes initial ionization of the gas, and the ions and electrons are then accelerated by the oscillating field.

The plasma gases are routed downstream under vacuum flow, and cross a neutralizing barrier 320 at the entrance inlet via 380 to the reactor chamber 330. The neutralizing barrier 320 is a metallic grid which presents a large surface area to the incoming gas. Collisions between the ionized gas species and the neutralizing barrier neutralize the ions, through recombination, such that the flow into the reactor chamber comprises mainly neutral species and reactive radicals.

In this first exemplary embodiment, the first plasma gas is composed of oxygen in combination with a fluorine-containing gas and optionally, a diluent gas. The diluent gas can be argon, nitrogen, hydrogen, forming gas (96% nitrogen and 4% hydrogen), helium, or a combination thereof. The amount of diluent gas is chosen to be sufficient to maintain a stable plasma, and generally the proportion of diluent gas in the plasma is less than about 20% of the total gas volume.

The fluorine-containing gas can be $SF_6$, $CHF_3$, $CH_2F_2$, $F_2$, $CF_4$, or $NF_3$. In this embodiment, the fluorine-containing gas is chosen to be $CF_4$. The $CF_4$ gas is highly reactive, and reacts with the surface layer of the polysilicon. The concentration of the fluorine gas is chosen to provide an adequate etch rate, and is generally in the range of about 5–40% of the total gas volume, or preferably in the range of about 9–11%. Higher concentrations of the fluorine-containing gas may lead to excessive formation of fluoropolymer residues, which can interfere with the etching of the polysilicon material. Typical process parameters for the planarizing process may be about 1 Torr total chamber pressure, about 720 sccm (standard cubic centimeters per minute) $O_2$ and about 80 sccm $CF_4$. The flow rates quoted are per wafer.

The power applied to the downstream microwave source may be up to about 3000 W per wafer, and is preferably about 1500 W to about 1700 W per wafer. The substrate temperature is maintained at between about 20° C. and about 100° C., and preferably about 40° C. to about 90° C., and more preferably about 70° C. The total process time for the first process is about 20–120 seconds, preferably about 50–70 seconds, and more preferably about 60 seconds.

The planarizing process 170 involves the downstream plasma only. A flow rate of about 500 sccm to about 3000 sccm is sufficient for maintaining about 500 mTorr to about 3 Torr of gas pressure in the downstream plasma source. The total flow rate for the first gas in this embodiment is about 800 sccm per wafer, and the pressure is maintained at about 1 Torr.

Figure 4:
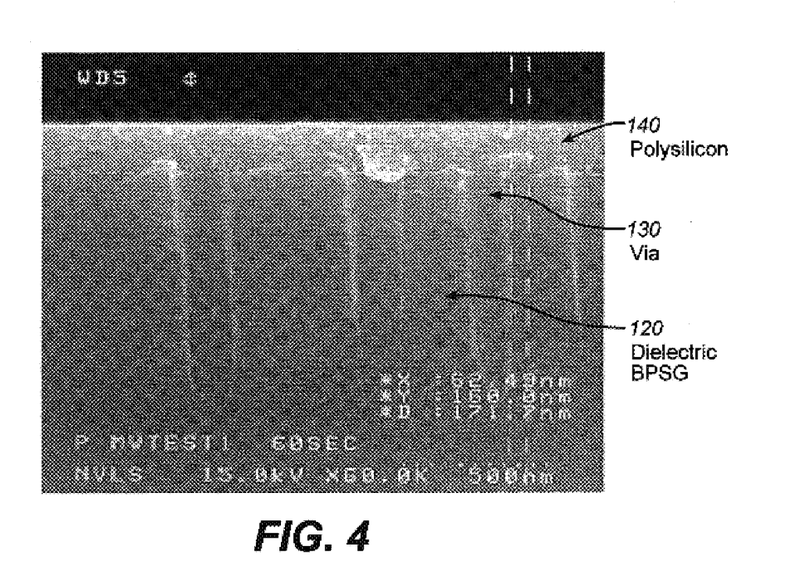
FIG. 4 shows a cross section of a portion of the integrated circuit device of FIG. 1, after planarizing the substrate according to an aspect of the invention.

FIG. 4 shows the device of FIG. 2, alter de application of the downstream plasma under the conditions described above. After about 60 seconds, the surface shows that the dimple topography which was located over the via holes in FIG. 2, has been removed, and the remaining polysilicon has a planar surface. After the film has been planarized, the substrate is ready for the bulk removal of the remaining polysilicon.

The bulk removal 180 of the polysilicon film is accomplished by the RF directional plasma in combination with the downstream microwave plasma. The RF directional plasma enhances the polysilicon removal rate. The plasma gases may again be a combination of $O_2$ and a fluorine-containing gas. The fluorine-containing gas may be one selected from the group consisting of $SF_6$, $CHF_3$, $F_2$, $CF_4$ and $NF_3$. In this embodiment, the fluorine gas is chosen to be $CF_4$. In some embodiments, the oxygen gas is mixed with a diluent gas which may be argon, nitrogen, hydrogen, forming gas, helium, or a combination thereof. The total amount of diluent gas is in an amount sufficient to provide a stable plasma, and the proportion of diluent gas to the total gas pressure may be in general less than about 20%. The proportion of $CF_4$ to the total gas volume in the removal process is somewhat higher than in the planarizing process, about 5%–50%, for example about 40%, and can be selected to adjust the etch rate of the polysilicon. The total gas flow supplied to the chamber can be in the range of about 300 sccm to about 3000 sccm. However, typical process parameters in this exemplary embodiment, for the polysilicon removal process are about 700 mTorr total chamber pressure, and about 300 sccm $O_2$ and about 180 sccm $CF_4$. The total power to the microwave source is about 500 to about 1500 W per wafer, and preferably about 800 W per wafer, and to the RF source is about 50 W to about 600 W per wafer, and preferably about 450 W per wafer. The substrate temperature is maintained at about 20° C. to about 100° C., and preferably about 70° C. until the endpoint of the process is reached. Using the conditions described here, a polysilicon removal rate of about 1.2 μm/min is achieved.

The RF plasma source is responsible for the uniformity of the process, and for generating detectable signals for the endpoint detection system. The endpoint system comprises a detector for detecting emissions from the by-products of the etching process. A sudden appearance or disappearance of an emission signal from a species indicates that the end of the process has arrived. The endpoint detection system in this embodiment detects photons emitted in the recombination of ions and electrons from the $SiF_4$ by-product of the polysilicon etching. The total process time required for the second process 180 is generally about 30–60 seconds.

Figure 5:
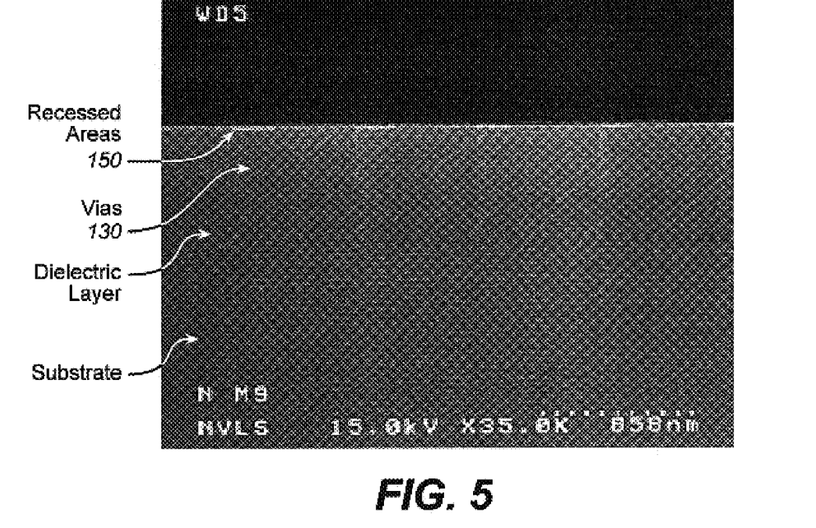
FIG. 5 shows a cross section of a portion of an integrated circuit device, after removing the bulk polysilicon from the substrate, according to an aspect of the invention.

FIG. 5 shows the devices of FIGS. 2 and 4, following the bulk polysilicon removal 180. The image in the figure was taken after exposure of the film to the direct plasma and microwave plasma for about 35 seconds, under the conditions described above. As can be seen in the figure, the polysilicon layer has been removed and the residual polysilicon recess area 150 is below the resolution limit of the imaging system.

Figure 6:
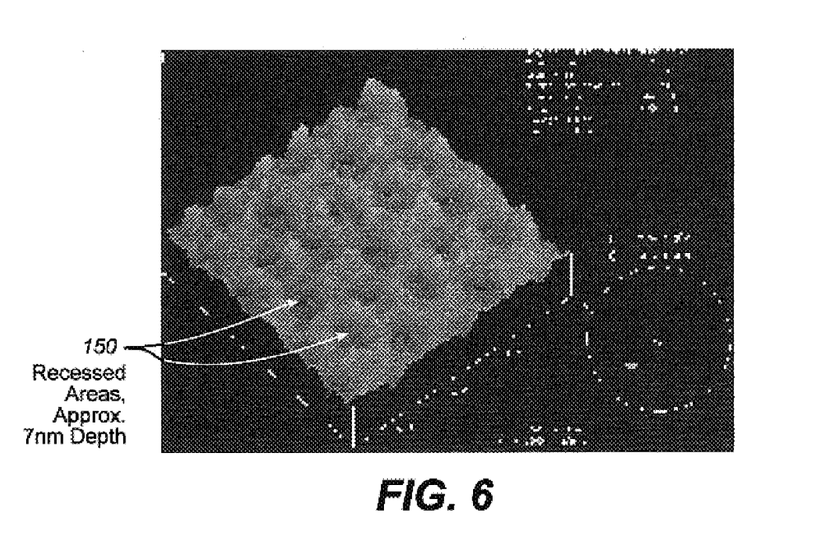
FIG. 6 shows an atomic force microscope image of the portion of the integrated circuit device shown in FIG. 5.

In order to gain sufficient resolution to measure the residual polysilicon recess height, the devices shown in FIG. 5 were imaged using an atomic force microscope (AFM). The resulting image is shown in FIG. 6. The AFM image shows that the recessed areas 150 of the polysilicon plugs in the dielectric vias is on the order of about 7 nm, well below the specification target of about 30 nm.

The optional procedure 190 can be included in the process flow of FIG. 1, which is designed to further improve recess height control, to achieve a recess height of less than about 10 nm. The procedure involves using the RF plasma source with or without the downstream plasma source for higher selectivity to the dielectric underlayer. This procedure is used to remove the last traces of the polysilicon layer, and it is designed to etch preferentially the dielectric material. Therefore, after application of this procedure, any recess height differential between the polysilicon plugs and the planar surface may be reversed, leaving a topographically flat surface. The duration of this optional procedure is generally quite short, between about 5 and 10 seconds, and preferably about 5 seconds. Typical process parameters for the optional procedure are about 500 sccm per wafer of $O_2$ and about 120 sccm of $CF_4$. Using this process, the recess height for the polysilicon plug may be less than about 10 nm. The use of the optional procedure can also allow the process to over-etch the polysilicon target layer, and avoid the use of an endpoint detection system.

Figure 7:
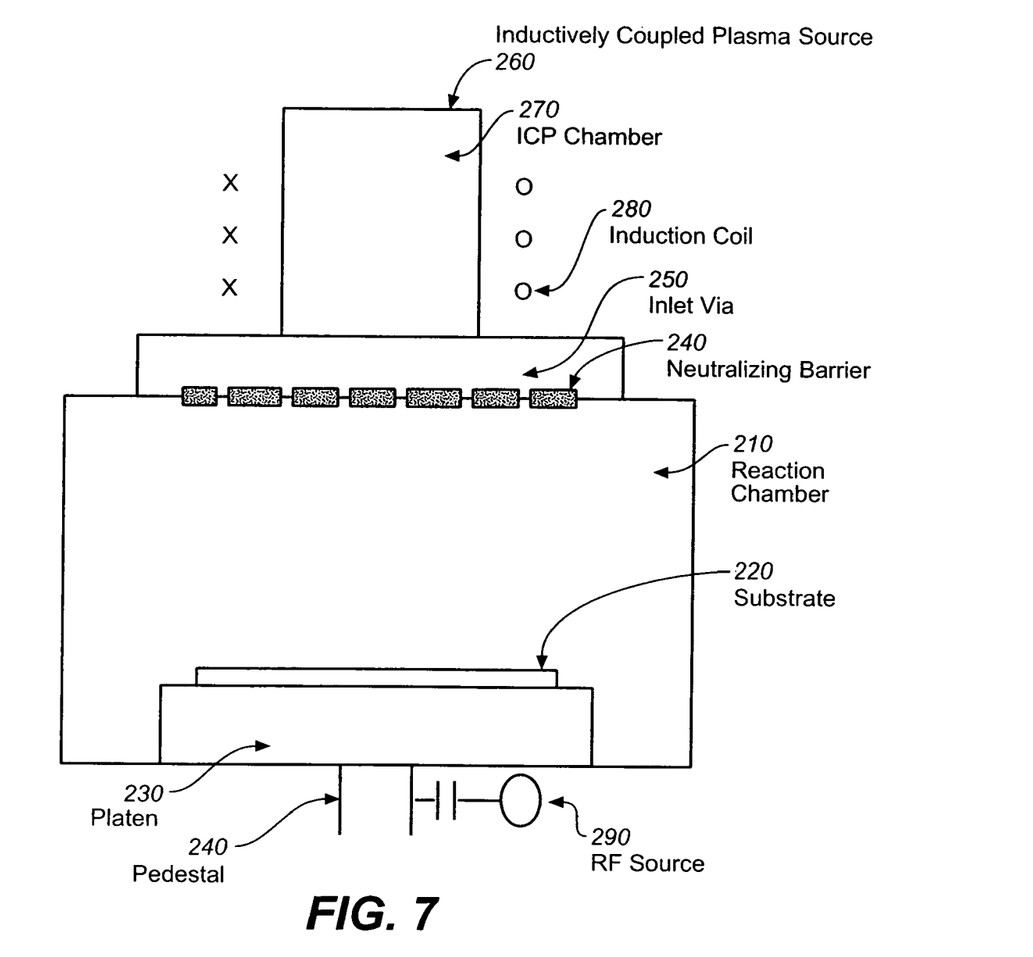
FIG. 7 is a simplified schematic diagram of a downstream plasma tool, equipped with an inductively coupled plasma source for the downstream plasma.

Other downstream plasma sources can be used to practice this invention, for example an inductively coupled plasma (ICP) source. Such a tool is shown schematically in FIG. 7. The tool is functionally similar to that shown in FIG. 3, except that the downstream plasma source 260 is a chamber 270 encircled by an induction coil 280 of wire. The coil 280 carries a RF current, which induces a current in the gas in the interior of the chamber. The induced current causes collisions between the ionized species in the gas, and the neutral species in the gas, until a plasma is formed of predominantly ionized species. The ionized plasma gas is then forced to pass by a neutralizing barrier 240, which neutralizes most of the ionized species through recombination. The plasma gas is then introduced into the reactor chamber 210 through the inlet via 250, and applied to the exposed substrate surface 220. The plasma gas interacts with the exposed surface of the substrate 220, held on a platen 230. The platen is connected to a RF power source 290, which causes an additional RF plasma to form above the surface of the substrate 220. The process that can be applied to practice the invention using the tool shown in FIG. 7, is the same as that shown in FIG. 1, and produces similar results.

The invention described herein can be used to generate flat, planar surfaces which are preferred for further IC processing. The invention as described can yield surfaces with a residual recess height of less than about 10 nm, well below the specification target of about 30 nm residual recess height. The process can be implemented on tools designed to provide a downstream plasma in addition to a direct, RF plasma. The downstream plasma provides most of the planarization effect, and the direct RF plasma performs the bulk etching of the film from the surface.

While this invention has been described in the context of the etching of a polysilicon film, it is clear that the invention can be applied to other materials having undesirable surface topography, such as for example, tungsten, $SiO_2$, or copper.

The invention is therefore not limited to the embodiments described above. For instance, the invention is not limited to the particular materials or process parameters, layer thicknesses, or other details. Likewise, the invention is not limited to the particular shape of the vias or their positioning relative to each other, and the invention is not limited to particular tool designs. Process conditions can be altered, and additional steps added, depending on the nature of the polysilicon films and the structure of film stacks. Various aspects and features of the present invention have been explained or described in relation to beliefs or theories, although it will be understood that the invention is not bound to any particular belief or theory. Other embodiments and variations within the scope of the invention, as defined by the appended claims, will occur to practitioners in view of the disclosure herein.

The invention claimed is:

1. A method for etching a material on a substrate, the method comprising:
   first exposing the material to a downstream plasma to planarize the material; and
   then exposing the material to a downstream plasma, which may be the same as or different from the downstream plasma of said first exposing, and a direct plasma, said then exposing comprising anisotropically etching the material.

2. The method of claim 1, wherein the material is selected from polysilicon, tungsten, $SiO_2$, and copper.

3. The method of claim 1, further comprising after said then exposing, exposing the substrate to a plasma selected from a downstream plasma, a direct plasma, and any combination thereof, said exposing the material to the plasma sufficient such that recess height is below about 30 mm.

4. The method of claim 3, said exposing the material to the plasma sufficient such that recess height is below about 10 nm.

5. The method of claim 1, wherein the downstream plasma of said first exposing comprises $O_2$ and a fluorine-containing gas.

6. The method of claim 5, wherein the fluorine-containing gas is selected from $SF_6$, $CHF_3$, $CH_2F_2$, $F_2$, $CF_4$, $NF_3$, and any combination thereof.

7. The method of claim 5, wherein the downstream plasma of said first exposing further comprises a gas selected from argon, nitrogen, hydrogen, forming gas, helium, and any combination thereof.

8. The method of claim 5, wherein a percentage concentration of the fluorine-containing gas is about 5%–40%.

9. The method of claim 8, wherein the percentage concentration of the fluorine-containing gas is about 9%–11%.

10. The method of claim 1, wherein the downstream plasma of said then exposing and the direct plasma comprise $O_2$ and a fluorine-containing gas.

11. The method of claim 10, wherein the fluorine-containing gas is selected from $SF_6$, $CHF_3$, $CH_2F_2$, $F_2$, $CF_4$, $NF_3$, and any combination thereof.

12. The method of claim 10, wherein the downstream plasma of said then exposing and the direct plasma further comprise a gas selected from argon, nitrogen, hydrogen, forming gas, helium, and any combination thereof.

13. The method of claim 10, wherein a percentage concentration of the fluorine-containing gas is about 5%–50%.

14. The method of claim 13, wherein the percentage concentration of the fluorine-containing gas is about 40%.

15. The method of claim 1, wherein the downstream plasma of said then exposing is formed from a downstream plasma source supplied with about 500 W to about 1500 W per substrate.

16. The method of claim 1, wherein the downstream plasma of said then exposing is formed from a downstream plasma source supplied with about 800 W per substrate.

17. The method of claim 1, wherein the direct plasma is formed from a direct plasma source supplied with about 50 W to about 600 W per substrate.

18. The method of claim 1, wherein a chamber pressure during said then exposing is about 700 mTorr.

19. The method of claim 1, wherein the downstream plasma of said first exposing comprises gas supplied at a rate of about 500 sccm to about 3000 sccm per substrate.

20. The method of claim 1, wherein the downstream plasma of said first exposing comprises gas supplied at a rate of about 800 sccm per substrate.

21. The method of claim 1, wherein the second downstream plasma of said then exposing and the direct plasma comprise gas supplied at a rate of about 300 sccm to about 3000 sccm per substrate.

22. The method of claim 1, wherein the downstream plasma of said then exposing and the direct plasma comprise gas supplied at a rate of about 500 sccm per substrate.

23. The method of claim 1, wherein a chamber pressure during said first exposing is about 500 mTorr to about 3 Torr.

24. The method of claim 23, wherein the chamber pressure during said first exposing is about 1 Torr.

25. The method of claim 1, wherein a substrate temperature is about 20° C. to about 100° C.

26. The method of claim 25, wherein the substrate temperature is about 40° C. to about 90° C.

27. The method of claim 1, wherein a duration of said first exposing is about 20 seconds to about 120 seconds.

28. The method of claim 27, wherein the duration of said first exposing is about 50 to about 70 seconds.

29. A method for etching a material on a substrate, the method comprising:
   first exposing the material to a downstream plasma to planarize the material; and
   then exposing the material to a downstream plasma, which may be the same as or different from the downstream plasma of said first exposing, and a direct plasma, said then exposing comprising anisotropically etching the material;
   wherein the downstream plasma of said first exposing is formed from a downstream plasma source supplied with up to about 3000 W per substrate.

30. The method of claim 29, wherein the downstream plasma of said first exposing is formed from a downstream plasma source supplied with about 1500 W to about 1700 W per substrate.

31. The method of claim 29, wherein the downstream plasma source is a selected from a microwave source and an inductively coupled plasma source.

32. A method for etching a material on a substrate, the method comprising:
   first exposing the material to a downstream plasma to planarize the material; and
   then exposing the material to a downstream plasma which may be the same as or different from the downstream plasma of said first exposing, and a direct plasma, said then exposing comprising anisotropically etching the material;
   wherein the direct plasma is formed from a direct plasma source supplied with about 450 W per substrate.

* * * * *

UNITED STATES PATENT AND TRADEMARK OFFICE
CERTIFICATE OF CORRECTION

PATENT NO. : 7,160,813 B1 Page 1 of 1
APPLICATION NO. : 10/293661
DATED : January 9, 2007
INVENTOR(S) : Chen et al.

It is certified that error appears in the above-identified patent and that said Letters Patent is hereby corrected as shown below:

Column 8, line 24, please delete "30 mm." and insert --30 nm.--.

Signed and Sealed this

Third Day of April, 2007

JON W. DUDAS
*Director of the United States Patent and Trademark Office*